(12) United States Patent
Buynoski et al.

(10) Patent No.: US 7,067,349 B1
(45) Date of Patent: Jun. 27, 2006

(54) ION PATH POLYMERS FOR ION-MOTION MEMORY

(75) Inventors: Matthew S. Buynoski, Palo Alto, CA (US); Richard P. Kingsborough, Acton, MA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 10/968,705

(22) Filed: Oct. 19, 2004

(51) Int. Cl.
*H01L 51/40* (2006.01)

(52) U.S. Cl. .................. 438/99; 257/E51.17
(58) Field of Classification Search .......... 438/99; 257/E51.017
See application file for complete search history.

(56) References Cited

U.S. PATENT DOCUMENTS

| | | | |
|---|---|---|---|
| 4,505,842 A * | 3/1985 | Kurkov et al. | 252/500 |
| 5,558,904 A * | 9/1996 | Hsieh et al. | 427/66 |
| 5,670,791 A * | 9/1997 | Halls et al. | 257/40 |
| 6,656,763 B1 | 12/2003 | Oglesby et al. | |
| 6,686,263 B1 | 2/2004 | Lopatin et al. | |
| 6,746,971 B1 | 6/2004 | Ngo et al. | |
| 6,753,247 B1 | 6/2004 | Okoroanyanwu et al. | |
| 6,768,157 B1 | 7/2004 | Krieger et al. | |
| 6,770,905 B1 | 8/2004 | Buynoski et al. | |
| 6,773,954 B1 | 8/2004 | Subramanian et al. | |
| 6,781,868 B1 | 8/2004 | Bulovic et al. | |
| 6,787,458 B1 | 9/2004 | Tripsas et al. | |
| 6,803,267 B1 | 10/2004 | Subramanian et al. | |

* cited by examiner

*Primary Examiner*—W. David Coleman
*Assistant Examiner*—Jarrett Stark
(74) *Attorney, Agent, or Firm*—Amin & Turocy, LLP (57) ABSTRACT

Methods and systems for improving at least one of carrier ion/charge mobility, distribution and permeability in a semiconducting polymer layer of a microelectronic device are disclosed. The methods include forming a semiconducting polymer layer containing at least one semiconducting polymer with one or more ion-complexing side-chain groups. The methods provide for the manufacture of microelectronic devices with one or more of improved carrier ion/charge mobility, distribution and permeability.

20 Claims, 9 Drawing Sheets

ION PATH POLYMERS FOR ION-MOTION MEMORY

TECHNICAL FIELD

The subject invention generally relates to semiconductor fabrication techniques. More particularly, the subject invention relates to methods and systems for improving the permeability and distribution of carrier ions and/or charges in semiconducting polymer layers of microelectronic devices.

BACKGROUND ART

Much of the progress in making computers and microelectronic devices faster, smaller and less expensive involves integration, squeezing ever more transistors and other electronic structures onto a postage stamp sized piece of silicon. A postage stamp sized piece of silicon may contain tens of millions of transistors, each transistor as small as a few hundred nanometers. However, silicon based devices are approaching their fundamental physical size limits.

In addition, inorganic solid state devices are generally encumbered with a complex architecture which leads to a high cost and a loss of data storage density. The circuitry of volatile semiconductor memories based on inorganic semiconductor material must constantly be supplied with electric current with a resulting heating and high electric power consumption in order to maintain stored information. Non-volatile semiconductor devices based on inorganic semiconductor material have a reduced data rate and relatively high power consumption and large degree of complexity.

Organic semiconducting materials, such as organic polymers, are increasingly examined as cost effective replacements for inorganic semiconducting materials in microelectronic devices. However, one of the concerns with the use of semiconducting polymers relates to the sub-optimal mobility of carrier ions/charges injected into the semiconducting polymer layer.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The subject invention provides methods and systems for enabling or improving at least one of carrier ion/charge mobility, permeability and distribution in a semiconducting polymer layer of a microelectronic device. More specifically, the semiconducting polymer layer of a microelectronic device is formed with at least one semiconducting polymer containing ion-complexing side-chain groups that facilitate at least one of ion/charge mobility, permeability and distribution in the semiconducting polymer layer. The subject invention facilitates the use or increases the usefulness of semiconducting polymers in the manufacture of microelectronic devices.

One aspect of the subject invention relates to methods that improve at least one of the mobility, distribution and permeability of carrier ions/charges injected into a semiconducting polymer layer of a polymer cell/device. The methods include forming a semiconducting polymer layer of a polymer memory cell/device with at least one semiconducting polymer containing ion-complexing side-chain groups that facilitate at least one of ion/charge mobility, distribution and permeability. In one embodiment of the subject invention, semiconducting polymers containing side-chain groups such as substituted and/or unsubstituted pyridines, bipyridines, ethers, thioethers, and derivatives thereof, can be used to form the semiconducting polymer layer.

Another aspect of the subject invention relates to providing a polymer memory device containing at least one polymer memory cell made of at least two electrodes; one or more passive layers; and a semiconducting polymer layer between electrodes, wherein the semiconducting polymer layer contains at least one semiconducting polymer with at least one ion-complexing side-chain group.

In yet another aspect of the subject invention, methods are provided for improving at least one of the mobility, permeability and distribution of carrier ions/charges injected into a semiconducting polymer layer of an organic thin film transistor. The methods include forming a gate electrode; forming an insulator layer; forming source and drain regions; and forming a semiconducting polymer layer contacting the source and the drain regions, wherein the semiconducting polymer layer contains at least one semiconducting polymer with ion-complexing side-chain groups.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DISCLOSURE OF INVENTION

The subject invention involves methods and systems for improving at least one of mobility, distribution and permeability of carrier ions/charges injected into a semiconducting polymer layer of a microelectronic device. The methods involve forming a semiconducting polymer layer containing one or more semiconducting polymers with one or more ion-complexing side-chain groups that facilitate one or more of carrier ion/charge mobility, distribution and permeability by providing optimal path for ion/charge motion. Examples of ion-complexing side-chain groups that facilitate at least one of carrier ion/charge mobility, distribution and permeability in a semiconducting polymer layer include substituted or unsubstituted pyridines, bipyridines, ethers, thioethers and derivatives thereof.

Examples of microelectronic devices that utilize semiconducting polymers to from memory elements include organic thin film transistors, nonvolatile polymer memory cells, programmable polymer memory cells, photodetectors, solar cells, chemical and biological sensors, photonic devices, and the like. The polymer cells described herein can be employed with logic devices such as central processing units (CPUs); as volatile memory devices such as DRAM devices, as SRAM devices, and the like; with input/output devices (I/O chips); and as non-volatile memory devices such as EEPROMs, EPROMs, PROMs, and the like.

Figure 1:
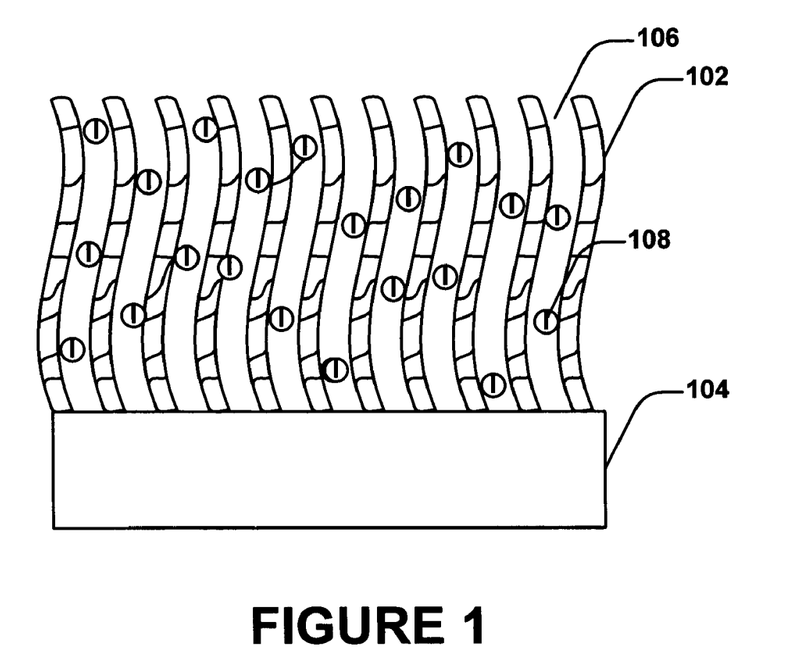
FIG. 1 illustrates a schematic view of an ideal semiconducting polymer layer of a memory cell/device.
Figure 2:
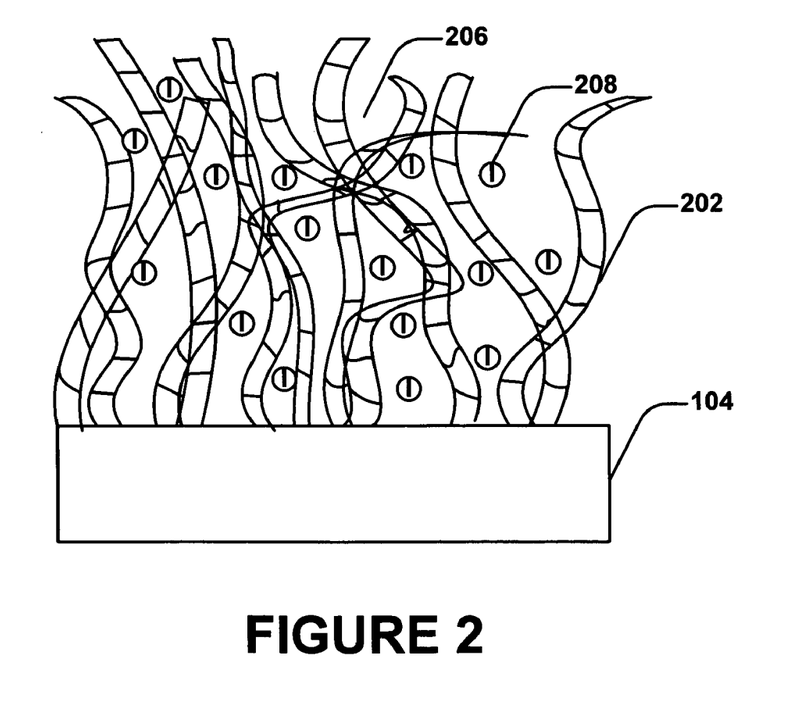
FIG. 2 illustrates a cross sectional view of a semiconducting polymer layer formed according to the prior art.

The conducting properties of polymer based microelectronic devices depend on one or more of the mobility, distribution and permeability of ions/charges injected into the semiconducting polymer layer. Ideally, the mobility, distribution and permeability of carrier ions/charges is optimal when clear and vertical channels are present between polymer molecules. The formation of clear, vertical channels is generally possible only if polymer molecules grow in an organized manner vertically from the substrate to which they are attached. FIG. 1 is a schematic illustration of an ideal polymer layer on a substrate 104, showing clear, vertical channels 106 between polymer molecules 102, providing an easy path for ions/charge 108. However, in many cases, polymers form/assemble in a random and chaotic pattern making it seemingly difficult for ions/charges to permeate and access the entire polymer layer. FIG. 2 is a schematic illustration of formation of polymer molecules 202 on a substrate 104, showing chaotic and random assembly of polymer molecules according to prior art. FIG. 2 shows channels that are not vertical between polymer molecules 206, preventing carrier ions/charges 208 from obtaining optimal access and permeability to the entire semiconducting polymer layer.

Although not wishing to be bound by any theory, it is believed that the subject invention, by providing a semiconducting polymer layer with at least one semiconducting polymer containing ion-complexing side-chain groups that can reversibly complex, bind, and/or accept carrier ions/charges, facilitates at least one of improved mobility, distribution and permeability of carrier ions/charges across the semiconducting polymer layer (that is, across the semiconducting layer as a whole). For instance, incorporation of a polymer with ion-complexing side-chain groups such as a pyridine, a bipyridine, an ether, and/or a thioether is believed to provide an easy path for ions/charges to hop from one polymer to the next, thereby mitigating the desirability of having vertically oriented polymers. Also, each polymer molecule itself may provide a pathway for ion migration from one ion-complexing side-group to the next, permitting distribution of ions/charges throughout the entire polymer layer.

Figure 3:
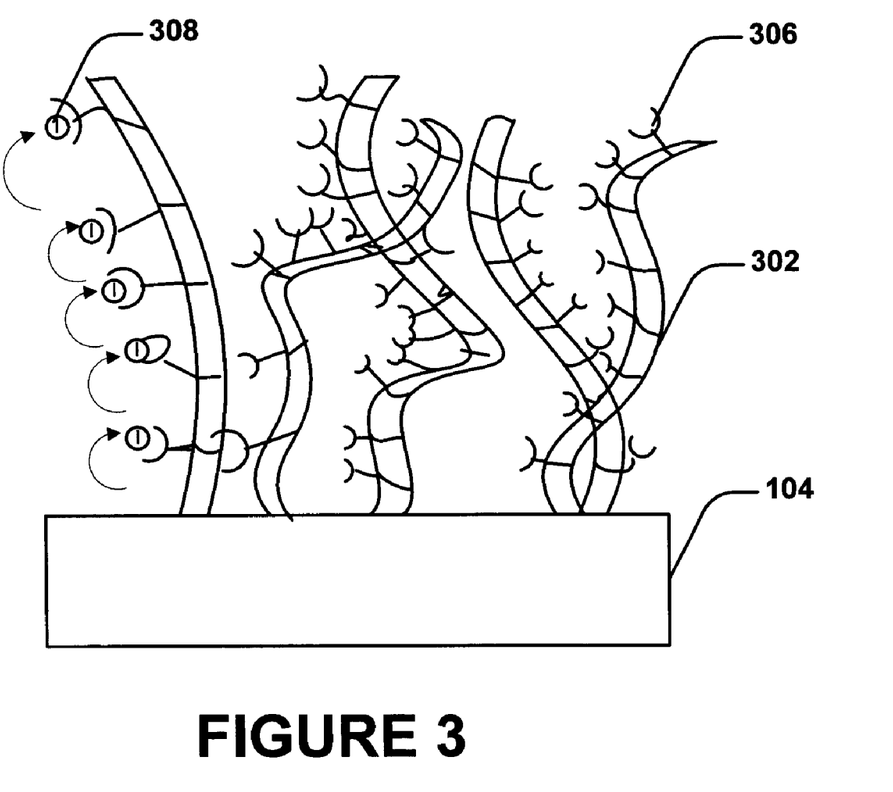
FIG. 3 is a schematic illustration of a semiconducting polymer layer formed according to one aspect of the subject invention.

FIG. 3 is a schematic illustration of semiconducting polymers 302 formed on a substrate 104 according to one aspect of the subject invention, showing polymer molecules with ion-complexing side-chain groups 306. FIG. 3 depicts an ion/charge 308 moving across a polymer molecule, hopping from one ion-complexing side-chain group to another. In FIG. 3, polymer molecules may be oriented in parallel to themselves and normal to the surface, or the polymer molecules may be randomly oriented. Since the polymer molecules made in accordance with the subject invention have ion-complexing side-groups, polymer orientation/positioning is of secondary concern.

The semiconducting polymer with ion-complexing side-chain groups of the subject invention can be any semiconducting polymer having one or more side-chain groups that can reversibly bind, accept, and/or complex with carrier ions/charges. In one embodiment of the subject invention, the semiconducting polymer with ion-complexing side-chain groups is a semiconducting polymer containing one or more of heterocyclic side group moieties, oxygen-containing side group moieties, sulfur-containing side group moieties, and nitrogen-containing side group moieties. In another embodiment of the subject invention, the semiconducting polymer with ion-complexing side-chain groups is a semiconducting polymer containing one or more of substituted and/or unsubstituted pyridines, bipyridines, terpyridines, quaterpyridines, quinquepyridines, sexipyridines or phenanthrolines, ethers, thioethers, and derivatives thereof as side-chain groups.

The semiconducting polymer with ion-complexing side-chain groups of the subject invention can be prepared by any suitable method making certain that the semiconducting properties of the semiconducting polymer layer are preserved. In one embodiment of the subject invention, the semiconducting polymer with ion-complexing side-chain groups can be formed from monomeric precursors of the semiconducting polymers containing one or more ion-complexing groups. The ion-complexing side-chain groups can be introduced into the monomeric precursors through suitable chemical reactions well known to a person skilled in the art. For example, ion-complexing groups, such as substituted and/or unsubstituted pyridine, bipyridine, terpyridine, quaterpyridine, quinquepyridine, sexipyridine or phenanthroline, ethers, thioethers, and derivatives thereof can be introduced into monomeric units by chemical reactions such as substitution, alkylation, modification, and/or addition type of reactions. In another embodiment of the subject invention, ion-complexing side-chain groups can be incorporated into semiconducting polymers during the assembly/formation of a semiconductor polymer layer. In yet another embodiment of the subject invention, the ion-complexing groups are introduced into the semiconducting polymer after the formation of the semiconducting polymer layer.

The ion-complexing side-chain groups of the subject invention can have any suitable linkage with a semiconducting polymer. For example, the ion-complexing side-chain groups can be linked/attached to the semiconducting polymers through covalent bonding.

The composition of the semiconducting polymer layer can be adjusted appropriately by varying the proportion of semiconducting polymers with and without ion-complexing side-chain groups such that the desirable semiconducting properties of the polymers are preserved. In one embodiment of the subject invention, all the semiconducting polymers contain ion-complexing side-chain groups. In another embodiment of the subject invention, the semiconducting polymer layer is formed using one or more semiconducting polymers containing no ion-complexing side chain groups and one or more semiconducting polymers containing ion-complexing side-chain groups. For example, the semiconducting polymer layer can be formed using equal proportion of semiconducting polymers with no ion-complexing side-chain groups and semiconducting polymers with ion-complexing side-chain groups. In another example, the semiconducting polymer layer contains from about 1% to about 99.99% by weight of the semiconducitng polymer with ion-complexing side-chain groups and from about 99% to about 0.01% by weight of the semiconducting polymer with no ion-complexing side-chain groups.

The number of ion-complexing side chain groups in a monomeric unit of a semiconducting polymer molecule can be varied to obtain at least one of optimal carrier ion/charge mobility, distribution and permeability while retaining the semiconducting properties of the semiconducting polymer layer. In one embodiment of the subject invention, each monomeric unit of the semiconducting polymer molecule with ion-complexing side-chain groups can have one ion-complexing side chain group. In another embodiment of the subject invention, each monomeric unit of a semiconducting polymer with ion-complexing side-chain group can have more than one ion-complexing side-chain group.

The number of ion-complexing side-chain groups in a semiconducting polymer can be varied appropriately to adjust the distance between successive ion-complexing side-chain groups in a semiconducting polymer molecule. In one embodiment of the subject invention, the proportion of ion-complexing side-chain groups to monomeric units of a semiconducting polymer molecule ranged from about 0.01:1 to about 1:1. For instance, in one embodiment of the subject invention, each monomeric unit of a semiconducting polymer can have one ion-complexing side chain group. In another instance, every 100 monomeric units of a semiconducting polymer molecule can have one ion-complexing side-chain group.

The ion-complexing side-chain groups in a semiconducting polymer molecule with ion-complexing side-chain groups can be chemically the same or different. For example, a semiconducting polymer molecule with ion-complexing side-chain groups may contain only pyridinyl moieties as ion-complexing side-chain groups. In another example, a semiconducting polymer molecule with ion-complexing side-chain groups may have more than one type of side-chain groups selected from ion-complexing groups such as substituted and/or unsubstituted pyridine, bipyridine, terpyridine, quaterpyridine, quinquepyridine, sexipyridine, phenanthroline, ether, thioether, and derivatives thereof.

The subject invention may be understood and its advantages appreciated in conjunction with figures and drawings, wherein like numerals represent like features throughout. It is understood that the description of these embodiments are merely illustrative and they should not be taken in a limiting sense. The embodiments of an apparatus or method of the subject invention described herein can be manufactured in a number of different positions and orientations. The term "carrier ion/charge" in the context of the subject invention refers to ions, electrons, holes, and the like. The term "ion-complexing side-chain group" refers to any chemical moiety that can reversibly bind, complex, and/or accept ions/charges.

Figure 4:
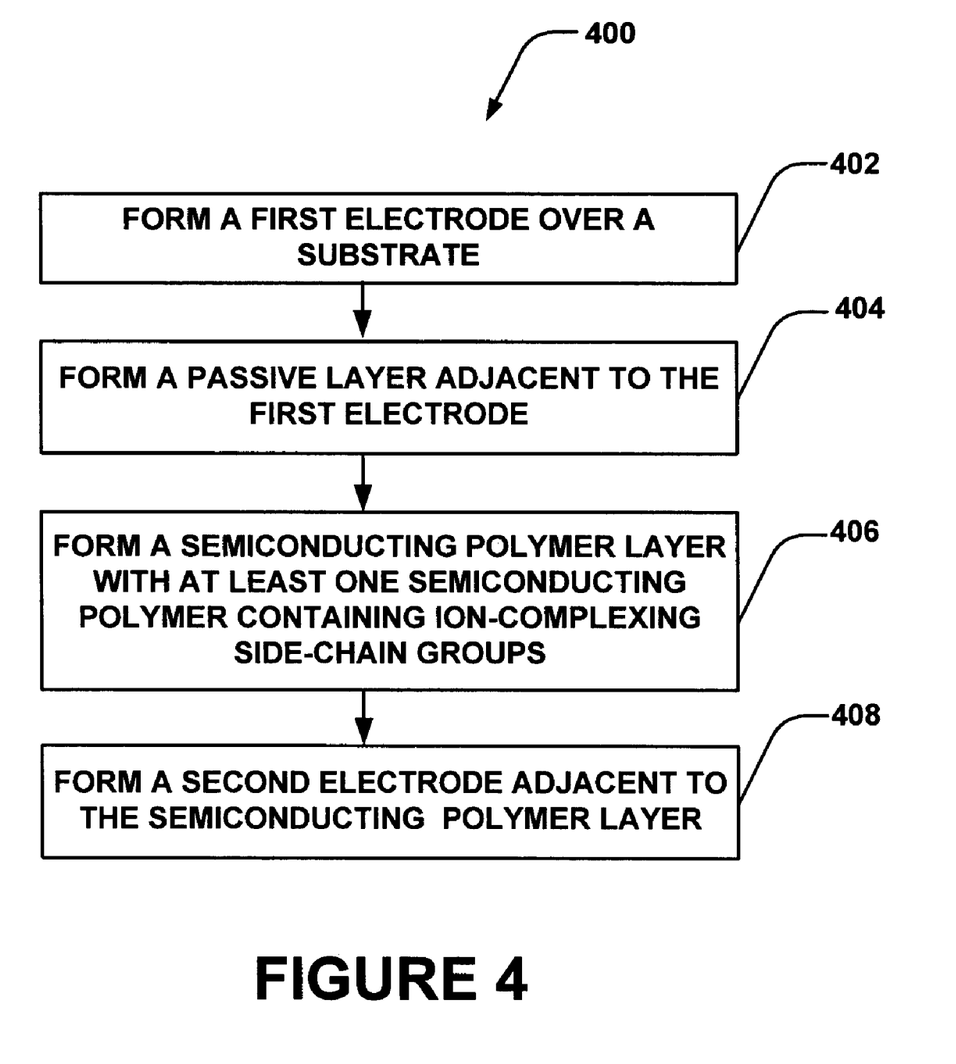
FIG. 4 illustrates a flow diagram of an exemplary methodology according to one aspect of the subject invention.

Referring to FIG. 4, a flow diagram of a method 400 for improving at least one of mobility, distribution and permeability of carrier ions/charge in a semiconducting polymer layer of a polymer memory cell according to one aspect of the subject invention is illustrated. For simplicity of explanation, the methodology is depicted and described as a series of acts. It is to be understood and appreciated that the subject invention is not limited by the acts illustrated and/or by the order of acts, for example acts can occur in various orders and/or concurrently, and with other acts not presented and described herein. Furthermore, not all illustrated acts may be required to implement the methodologies in accordance with the subject invention. In addition, those skilled in the art will understand and appreciate that the methodologies could alternatively be represented as a series of interrelated states via a state diagram or events. The method 400 involves forming a first electrode layer on a substrate (act 402), forming a passive layer adjacent to the first electrode (act 404), forming a semiconducting polymer layer with at least one semiconducting polymer containing ion-complexing side-chain groups (act 406), and forming a second electrode over the semiconducting polymer layer (act 408).

Figure 5:
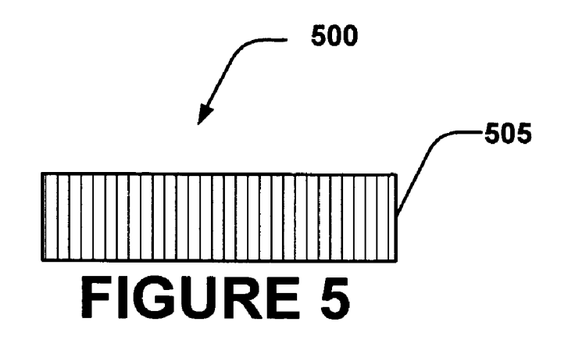
FIGS. 5–9 illustrate cross-sectional views of a polymer memory cell in various states of manufacture in accordance with the methodology described in FIG. 4.

FIGS. 5–9 illustrate a polymer memory cell in various states of manufacture in accordance with the methodology described in FIG. 4. FIG. 5 is a cross-sectional illustration of a polymer memory cell 500 on a substrate 505 utilized to perform the methodology described in FIG. 4. The substrate 505 can be any substrate used in the course of semiconductor processing or any semiconductor surfaces. The substrate 505 is formed using methods known to one skilled in the art. Typically, the substrate 505 is a silicon substrate, optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc.

Figure 6:
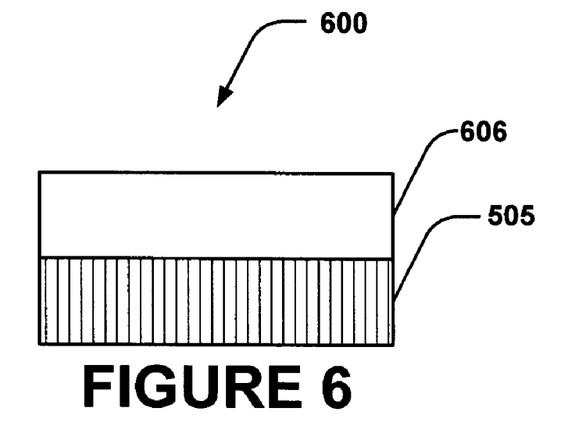

Act 402 of the method 400 is forming a first electrode on the substrate 505. FIG. 6 is a cross-sectional illustration of a polymer memory cell 600 showing the first electrode 606 over the substrate 505. The first electrode 606 is formed using methods known to one skilled in the art. For example, the first electrode 606 is formed by depositing metals using techniques such as etching, evaporation, physical vapor deposition (PVD), chemical vapor deposition (CVD) and plasma enhanced chemical vapor deposition (PECVD).

The first electrode 606 may or may not cover the entire surface of the substrate 505. The first electrode 606 is made of conductive material; such as a conductive metal, conductive metal alloys, conductive metal oxides, conductive polymer films, semiconductive materials, and the like. Specific examples of materials for the first electrode 606 include one or more of aluminum, chromium, cobalt, copper, germanium, gold, magnesium, manganese, molybdenum, indium, iron, nickel, palladium, platinum, silver, titanium, zinc, and alloys thereof; indium-tin oxide (ITO); polysilicon; doped amorphous silicon; metal silicides; and the like. Alloy electrodes specifically include Hastelloy®, Kovar®, Invar, Monel®, Inconel®, brass, stainless steel, magnesium-silver alloy, and various other alloys.

The thickness and width of the first electrode 606 may depend upon the specific lithography and design rules. In one embodiment, the thickness of the first electrode 606 is about 0.01 μm or more and about 10 μm or less. In another embodiment, the thickness of the first electrode 606 is about 0.05 μm or more and about 5 μm or less. In yet another embodiment, the thickness of the first electrode 606 is about 0.1 μm or more and about 1 μm or less. One skilled in the art would recognize that the first electrode can be placed in a variety of positions without losing the advantages of the subject invention.

Figure 7:
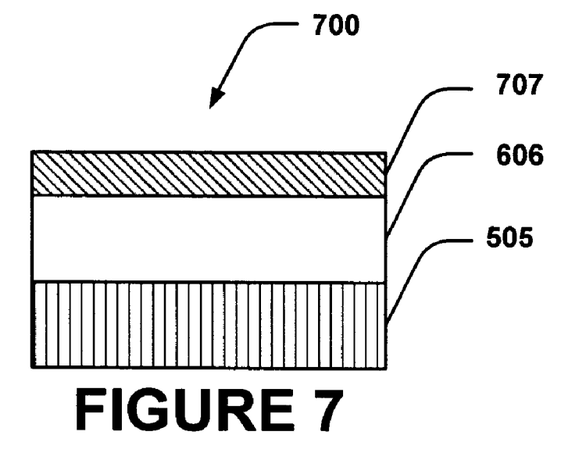

Act 404 of the method 400 is forming of a passive layer. FIG. 7 is a cross-sectional illustration of a polymer memory cell 700 showing the substrate 505, the first electrode 606 and a passive layer 707. The passive layer 707 is formed adjacent to the first electrode 606. The passive layer 707 can be made of at least one conductivity facilitating compound. Examples of conductivity facilitating compounds that may constitute the passive layer 707 include one or more of copper sulfide ($Cu_2S$, CuS), copper rich copper sulfide ($Cu_3S$, CuS; $Cu_3S$, $Cu_2S$), copper oxide (CuO, $Cu_2O$), copper selenide ($Cu_2Se$, CuSe), copper telluride ($Cu_2Te$, CuTe), manganese oxide ($MnO_2$), titanium dioxide ($TiO_2$), indium oxide ($I_3O_4$), silver sulfide ($Ag_2S$, AgS), gold sulfide ($Au_2S$, AuS), iron oxide ($Fe_3O_4$), cobalt arsenide ($CoAs_2$), nickel arsenide (NiAs), and the like. The conductivity facilitating compounds do not necessarily dissociate into ions under the strength of the electric field, although ions may move through them. The passive layer 707 may contain two or more subpassive layers, each sublayer containing the same, different, or multiple conductivity facilitating compounds.

The passive layer 707 is formed using oxidation techniques, formed via gas phase reactions, implantation techniques, or deposited on/between electrodes. In some instances, the passive layer 707 may be treated with a plasma after it is formed. The plasma treatment modifies the energy barrier of the passive layer 707.

In one embodiment, the passive layer 707 containing the conductivity facilitating compound has a thickness of about 2 Å or more and about 0.1 µm or less. In another embodiment, the passive layer 707 has a thickness of about 10 Å or more and about 0.01 µm or less.

Figure 8:
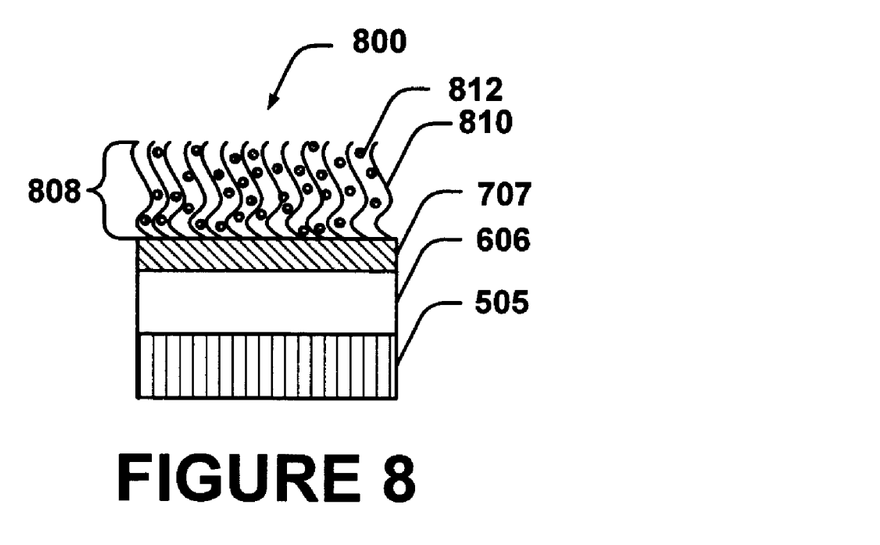

Act 406 of method 400 is forming a semiconducting polymer layer with at least one semiconducting polymer layer containing ion-complexing side-chain groups. FIG. 8 is a cross-sectional illustration of a polymer memory cell 800 undergoing act 406, showing the substrate 505, the first electrode layer 606, the passive layer 707, and a semiconducting polymer layer 808 containing one or more semiconducting polymers. The semiconducting polymer layer 808 of the subject invention contains at least one semiconducting polymer 810 with one or more ion-comeplexing side-chain groups 812 as described earlier.

The semiconducting polymer 810 of act 406 can be formed by spin-on techniques (depositing a mixture of the polymer/polymer precursor and a solvent, then removing the solvent from the substrate/electrode), by chemical vapor deposition (CVD) optionally including a gas reaction, gas phase deposition, and the like. CVD includes low pressure chemical vapor deposition (LPCVD), plasma enhanced chemical vapor deposition (PECVD), and high density chemical vapor deposition (HDCVD). During formation or deposition, the polymer material may self assemble between electrode layers. It is not typically necessary to functionalize one or more ends of the organic polymer in order to attach it to an electrode/passive layer.

The semiconducting polymer layer 808 can contain one or more semiconducting polymers, wherein at least one semiconducting polymer is provided with ion-complexing side-chain groups. Examples of semiconducting polymers which can be used to form semiconducting polymer layer 808 include conjugated organic polymers, organometallic polymers.

The organic polymer typically contains a conjugated organic polymer. The polymer backbone of the conjugated organic polymer extends lengthwise between the electrodes. The conjugated organic polymer may be linear or branched, so long as the polymer retains its conjugated nature. Conjugated polymers are characterized in that they have overlapping π orbitals. Conjugated polymers are also characterized in that they may assume two or more resonant structures. The conjugated nature of the conjugated organic polymer contributes to the controllably conductive properties of the controllably conductive media.

In this connection, the semiconducting polymer, such as a conjugated organic polymer, has the ability to donate and accept charges (holes and/or electrons). Generally, the semiconducting polymer or an atom/moiety in the polymer has at least two relatively stable states. The two relatively stable oxidation states permit the semiconducting polymer to donate and accept charges and electrically interact with the conductivity facilitating compound. The ability of the semiconducting polymer layer to donate and accept charges and electrically interact with the passive layer also depends on the identity of the conductivity facilitating compound.

The organic polymers (or the organic monomers constituting the organic polymers) may be cyclic or acyclic. During formation or deposition, the organic polymer self assembles between the electrodes. Examples of conjugated organic polymers include one or more of poly(p-phenylene vinylene); polyporphyrins; porphyrinic macrocycles, thiol-derivatized polyporphyrins; polymetallocenes such as polyferrocenes, polyphthalocyanines; polyvinylenes; polystiroles; polyacetylene; polydiphenylacetylene; poly(t-butyl)diphenylacetylene; poly(trifluoromethyl)diphenylacetylene; polybis(trifluoromethyl)acetylene; polybis(t-butyldiphenyl)acetylene; poly(trimethylsilyl)diphenylacetylene; poly(carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl) phenylacetylene; poly(trimethylsilyl) pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polythiophene; polypyrrole; polysilane; polystyrene; polyfuran; polyindole; polyazulene; polyphenylene; polyfluorenes, polypyridine; polybipyridine; polyphthalocyanine; polysexithiofene; poly(siliconoxohemiporphyrazine); poly(germaniumoxohemiporphyrazine); poly(ethylenedioxythiophene); polymetallocene complexes (Fe, V, Cr, Co, Ni and the like); polypyridine metal complexes (Ru, Os and the like); and the like.

The semiconducting polymer layer 808 can be of any suitable thickness. In one embodiment, the semiconducting polymer layer 808 has a thickness of about 0.001 µm or more and about 5 µm or less. In another embodiment, the semiconducting polymer layer 808 has a thickness of about 0.01 µm or more and about 2.5 µm or less. In yet another embodiment, the semiconducting polymer layer 808 has a thickness of about 0.05 µm or more and about 1 µm or less.

Figure 9:
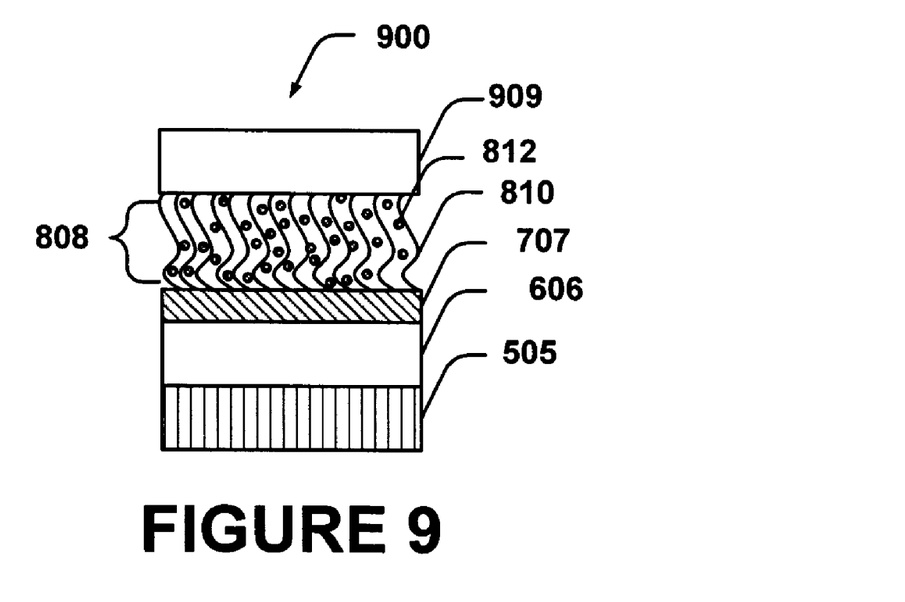

Act 408 of the method 400 is forming a second electrode. FIG. 9 is a cross-sectional illustration of a polymer cell 900 undergoing the formation of the second electrode 909. The second electrode 909 is formed overlying the semiconducting polymer layer 808. The second electrode 909 may be formed in a similar way as that of the first electrode 606, or in a manner different from that of the first electrode 606. In one embodiment, the second electrode 909 includes copper and/or copper containing compounds. In another embodiment, the second electrode may not contain copper and/or copper containing compounds.

After the formation of the second electrode 909, further processing may be carried out on polymer cell/device 900 to achieve a desired pattern and interconnects using techniques well known to a person skilled in the art.

The passive layer 707 may in some instances act as a catalyst when forming the semiconducting polymer layer, particularly when the semiconducting polymer layer 808 contains a conjugated organic polymer. In this connection, the polymer backbone of the conjugated organic polymer may initially form adjacent to the passive layer (on the side opposite the copper containing electrode), and grow or assemble away substantially perpendicular to the passive layer surface.

A covalent bond may be formed between the semiconducting polymer material 808 and the passive layer 707. Alternatively, close contact is required to provide good charge carrier/electron exchange between the semiconducting polymer layer 808 and the passive layer 707. The semiconducting polymer layer 808 and the passive layer 707 are electrically coupled in that charge carrier/electron exchange occurs between the two layers. Optionally, before forming the passive layer 707, the first electrode 606 may be treated to improve the contact between the passive layer 707 and the first electrode 606.

The method 400 is described only as an exemplary embodiment, and it should be noted that a person skilled in the art would appreciate that the advantages of the subject invention can be achieved by modifying and changing the way the method 400 is carried out. For example, it is possible to use more than two electrodes and still maintain the advantages of the subject invention. Similarly, the number and placement of passive layers, semiconducting polymer layers, electrodes, and substrate can be modified while maintaining the advantages of the subject invention.

Figure 10:
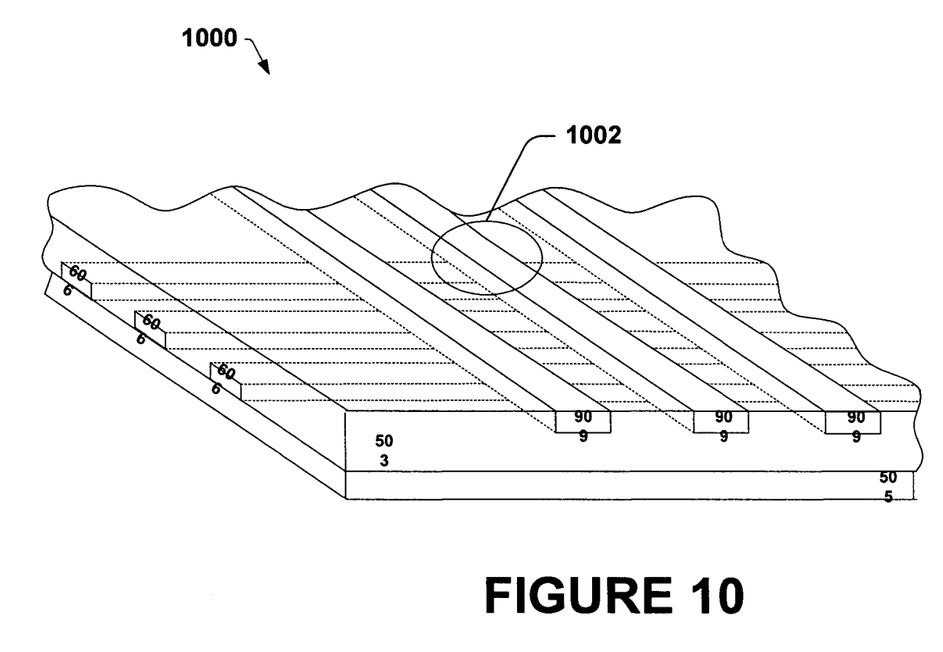
FIG. 10 illustrates an exemplary polymer memory device formed in accordance with one aspect of the subject invention.

Referring to FIG. 10, a brief description of a microelectronic polymer memory device 1000 containing a plurality of polymer memory cells positioned on or over a substrate 505 in accordance with one aspect of the invention is shown. The microelectronic polymer memory device 1000 contains a desired number of polymer memory cells, as determined by the number of rows, columns, and layers (three dimensional orientation described later) positioned on a substrate 505. The polymer memory cells are formed in a dielectric 503. The first electrode 606 and the second electrode 909 are shown in substantially perpendicular orientation, although other orientations are possible to achieve the structure of the exploded view 1002. An exploded view 1002 of a polymer memory cell 1004 shown in FIG. 11 and contains a substrate 505, a first electrode 606, a passive layer 707, and a second electrode 909 with a semiconducting polymer layer 808 therebetween. The semiconducting polymer layer 808 contains at least one semiconducting polymer 810 with at least one ion-complexing side chain group 812. Peripheral circuitry and devices are not shown for brevity.

The substrate 505, the passive layer 606, the electrodes 707 and 909, the semiconducting polymer layer 808 containing polymer with ion-complexing side-chain groups have been described earlier and all the methods and materials described before can be used to manufacture device 1000. The dielectric 503 is formed by techniques known to one skilled in the art. Any suitable dielectric can be used as dielectric 503. Both inorganic and organic dielectrics can be used.

Figure 11:
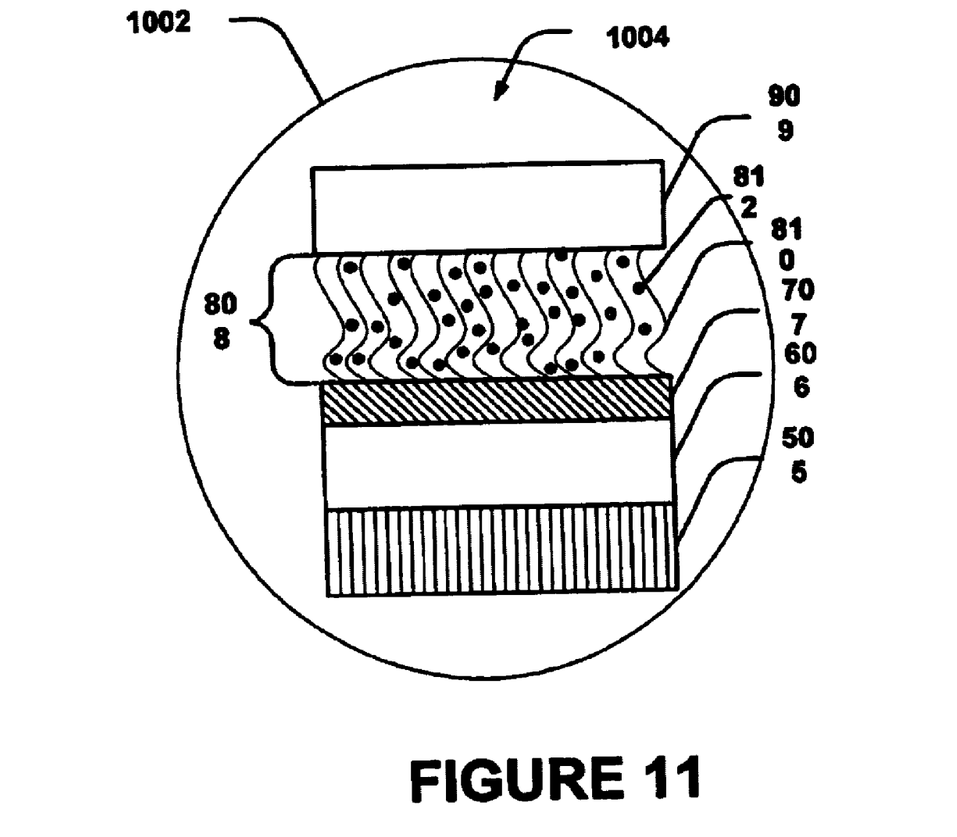
FIG. 11 illustrates an exploded cross-sectional view of an exemplary polymer memory cell as depicted in FIG. 10.

The semiconducting polymer layer 808 along with the passive layer 707 comprises the controllably conductive media. The controllably conductive media can be rendered conductive or non-conductive in a controllable manner using an external stimuli. Generally, in the absence of an external stimulus, the controllably conductive media is non-conductive or has high impedance. Further, in some embodiments, multiple degrees of conductivity/resistivity may be established for the controllably conductive media in a controllable manner. For example, the multiple degrees of conductivity/resistivity for the controllably conductive media may include a non-conductive state, a highly conductive state, a semiconductive state, and resistive state(s) with various levels of resistance (in other words, the controllably conductive media may have a plurality of conductive states).

Switching the polymer memory cell to the "on" state from the "off" state occurs when an external stimuli such as an applied electric field exceeds a threshold value. Switching the polymer memory cell to the "off" state from the "on" state occurs when an external stimulus exceeds a threshold value of the opposite polarity. The threshold value varies depending upon a number of factors including the identity of the materials that constitute the organic memory cell and the passive layer, the thickness of the various layers, and the like.

Generally speaking, the presence of an external stimuli such as an applied electric field that exceeds a threshold value ("programming" state) permits an applied voltage to write or erase information into/from the organic memory cell and the presence of an external stimuli such as an applied electric field that is less than a threshold value permits an applied voltage to read information from the polymer memory cell; whereas external stimuli that do not exceed a threshold value do not write or erase information into/from the organic memory cell.

To write information into the polymer memory cell, a voltage or pulse signal that exceeds the threshold is applied. To read information written into the polymer memory cell, a voltage or electric field of any polarity is applied. Measuring the impedance determines whether the organic memory cell is in a low impedance state or a high impedance state (and thus whether it is "on" or "off"). To erase information written into the polymer memory cell, a negative voltage opposite in polarity to the writing signal, that exceeds a threshold value, is applied.

The conductivity facilitating compound of the passive layer 707 contributes to the controllably conductive properties of the controllably conductive media. The conductivity facilitating compound has the ability to donate and accept charges (holes and/or electrons) and/or act as a source of copper ions. The passive layer 707 thus may transport holes, electrons, and/or ions between an electrode and the semiconducting polymer layer/passive layer interface, facilitate charge/carrier injection into the organic semiconducting polymer layer, and/or increase the concentration of a charge carrier (ions, holes and/or electrons) in the semiconducting polymer layer 808. In some instances, the passive layer 707 may store opposite charges thereby providing a balance of charges in the organic memory device as a whole. Storing charges/charge carriers is facilitated by the existence of two relatively stable oxidation states for the conductivity facilitating compound. The subject invention advantageously improves at least one of charge/carrier mobility, distribution and permeability in the semiconducting polymer.

The fermi level of the passive layer 707 is close to the valence band of the semiconducting polymer layer 808. Consequently, the injected charge carrier (into the semiconducting polymer layer 808) may recombine with the charge at the passive layer 707 if the energy band of the charged semiconducting polymer layer 808 does not substantially change. Positioning energy bands involves compromising between each of charge injection and length of charge (data) retention time.

Figure 12:
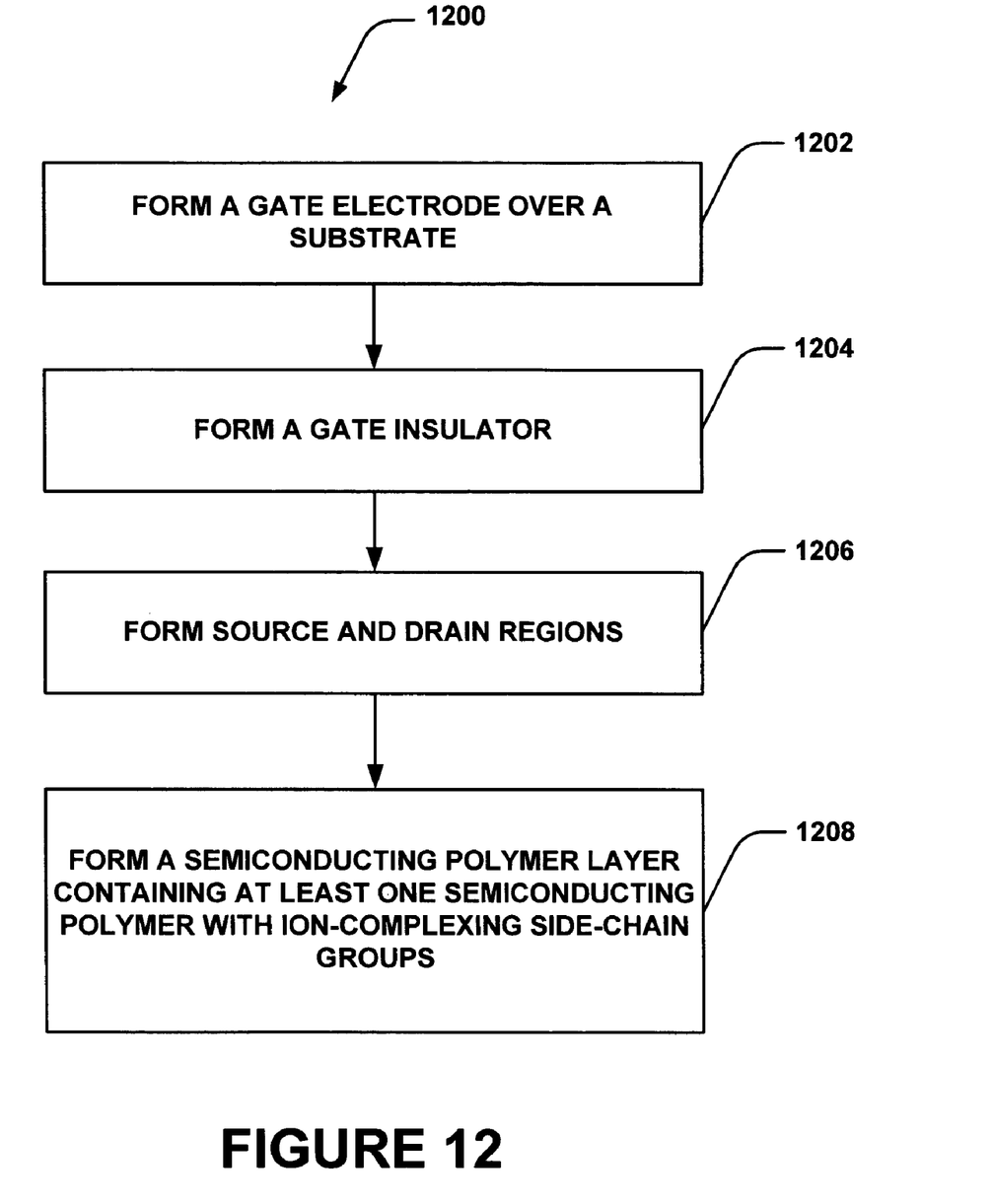
FIG. 12 illustrates a flow diagram of an exemplary methodology according to one aspect of the subject invention.

According to yet another aspect of the subject invention, a method is provided to improve at least one of carrier ion/charge mobility, distribution and permeability in a semiconducting polymer layer of an organic thin film transistor. FIG. 12 depicts a flow chart of an exemplary method 1200 for improving at least one of carrier ion/charge mobility, distribution, and permeability in a semiconducting polymer layer of an organic thin film transistor. The method 1200 involves forming a gate electrode (act 1202), forming an insulator (act 1204), forming source and drain regions (act 1206), and forming a semiconducting polymer layer containing at least one semiconducting polymer with ion-complexing side-chain groups (act 1208).

For simplicity of explanation, the methodologies are depicted and described as a series of acts. It is to be understood and appreciated that the subject invention is not limited by the acts illustrated and/or by the order of acts, for example acts can occur in various orders and/or concurrently, and with other acts not presented and described herein. Furthermore, not all illustrated acts may be required to implement the methodologies in accordance with the subject invention. In addition, those skilled in the art will understand and appreciate that the methodologies could alternatively be represented as a series of interrelated states via a state diagram or events.

Figure 13:
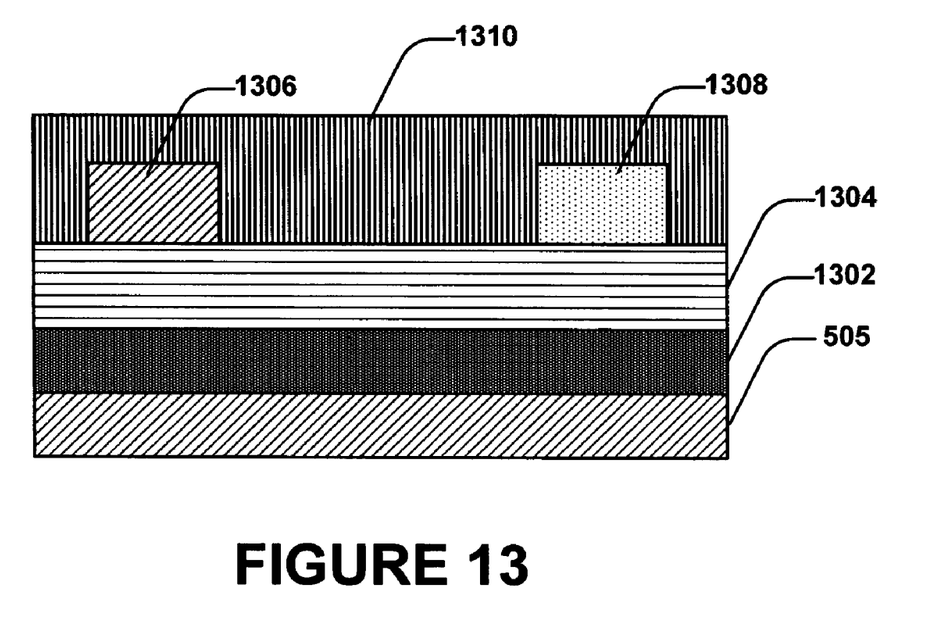
FIG. 13 is a cross sectional view of an organic thin film transistor undergoing fabrication in accordance with the methodology illustrated in FIG. 12.

FIG. 13 is a cross sectional illustration of an organic thin film transistor undergoing fabrication according to method 1200. FIG. 13 shows a substrate 505, a gate electrode 1302, a gate insulator 1304, a source region 1306, a drain region 1308, a semiconducting polymer layer 1310. In one embodiment of the subject invention, act 1202 is forming gate electrode 1302 on a substrate 505. The substrate 505 is described before and all the methods and materials described before can be applied here. Optionally, the substrate 505 may be a flexible substrate such as plastic or glass.

The gate electrode 1302 is deposited onto the substrate 505. Any suitable material can be used to form the gate electrode. Examples of materials that can be used to form a gate electrode include conductive materials such as metals, metal alloys, and metal compounds. General examples include aluminum, silicon, molybdenum, zirconium, niobium, copper, tungsten, bismuth, nickel, tantalum, titanium, and compounds and alloys thereof. The methods to form the gate electrode 1302 are well known, and are similar to the ones described earlier during description of the electrode 606 of method 400.

Act 1204 is forming a gate insulator layer 1304 adjacent to the gate electrode 1302. In one embodiment of the subject invention, the gate insulator 1304 is formed by anodization of the gate electrode 1302. Gate electrode materials that can be anodized include Si, Al, Ti, Zr, Hf, V, Nb, Ta, Mo, W, and alloys comprised primarily of these elements. The methods to form insulating layer 1304 over at least a portion of gate electrode are well known to persons skilled in the art.

Act 1206 of method 1200 is fabrication of source and drain regions. An electrically conducting source region 1306 and a drain region 1308 are formed over the gate insulator 1304. The source and drain regions may be spaced apart. Any suitable material can be used to form the source region 1306 and the drain region 1308. In one embodiment of the subject invention, the source region 1306 and the drain region 1308 are formed using Ag. Standard lithographic techniques known to a person skilled in the art may be used to pattern the source 1306 and the drain 1308 regions.

Act 1208 of method 1200 is formation of a semiconductor polymer layer 1310 contacting at least a portion of the gate electrode 1302, the source 1306, and the drain 1308. The semiconductor polymer layer 1310 contains at least one semiconducting polymer with ion-complexing side chain groups. The materials and methods to form the semiconductor polymer layer 1310 are similar to the forming of the semiconductor polymer layer 808 and therefore, are not described here. The semiconducting polymer with ion-complexing side-chain groups described earlier can be used to form the semiconducting polymer layer 1310.

Although method 1200 is described using one exemplary configuration for making an organic transistor, a person skilled in the art would appreciate that it is within the scope of the subject invention to fabricate organic transistors with different configurations without deviating from the scope of the subject invention. For example, a person skilled in the art would be able to change the positions of the source region, drain region, gate region, insulating layer, and semiconducting polymer layer without losing the advantages of the subject invention. Similarly, it should be noted that other microelectronic devices such as organic light emitting diodes can be advantageously manufactured using the subject invention.

The methods and systems of improving at least one of ion/charge distribution, mobility, and permeability in a semiconducting polymer layer described in the subject invention are useful for any device employing polymer semiconductors. For example, the semiconducting polymer devices with improved memory are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and light weight of the organic memory devices. Examples of hand-held devices include cell phones and other two way communication devices, personal data assistants, pagers, notebook computers, remote controls, recorders (video and audio), radios, small televisions and web viewers, cameras, and the like.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for improving at least one of carrier ion/charge mobility, permeability and distribution in a semiconducting polymer layer of a polymer memory cell, comprising:

providing a first electrode on a substrate;
forming a passive layer over the first electrode;
forming a semiconducting polymer layer over the passive layer, wherein the semiconducting polymer layer comprises at least one semiconducting polymer comprising one or more ion-complexing side-chain groups that reversibly binds, complexes, or accepts carrier ions/charges, the proportion of ion-complexing side-chain groups to a monomeric precursor of the semiconducting polymer ranges from about 0.01:1 to about 1:1 to facilitate carrier ion/charge mobility by providing a path for carrier ion/charge motion from one ion-complexing side-chain group to another; and providing a second electrode over the semiconducting polymer layer.

2. The method of claim 1, wherein the ion-complexing side-chain group comprises at least one selected from the group consisting of pyridine, bipyridine, terpyridine, quaterpyridine, quinquepyridine, sexipyridine, phenanthroline, ethers, thioethers, and derivatives thereof.

3. The method of claim 1, wherein the ion-complexing groups are incorporated into monomeric precursors of the semiconducting polymers before forming the semiconducting polymer layer.

4. The method of claim 1, wherein the ion-complexing groups are introduced into the semiconducting polymer after the formation of the semiconducting polymer layer.

5. The method of claim 1, wherein the ion-complexing groups are introduced into the semiconducting polymer during the formation of the semiconducting polymer layer.

6. The method of claim 1, wherein the semiconducting polymer containing ion-complexing side-chain groups comprises more than one type of ion-complexing side-chain groups.

7. The method of claim 1, wherein the semiconducting polymer layer comprises from about 1% to about 99.99% by weight of the semiconducting polymer with ion-complexing side-chain groups and from about 99% to about 0.01% by weight of the semiconducting polymer with no ion-complexing side-chain groups.

8. The method of claim 1, wherein the ion-complexing side-chain groups are linked to the semiconducting polymer via covalent linkage.

9. The method of claim 1, wherein each monomeric precursor comprises one or more ion-complexing side-chain groups.

10. The method of claim 1, wherein the ion-complexing side-chain groups comprise at least one of bipyridine, terpyridine, quaterpyridine, quinquepyridine, sexipyridine, phenanthroline, ethers, thioethers, and derivatives thereof.

11. A method of fabricating an organic thin film transistor, comprising:
depositing a gate electrode;
forming an insulator adjacent to the gate electrode;
forming source and drain regions; and
forming a semiconducting polymer layer, wherein the semiconducting polymer layer comprises at least one semiconducting polymer with one or more ion-complexing side-chain groups that reversibly binds, complexes, or accepts ions/charges, the proportion of ion-complexing side-chain groups to a monomeric precursor of the semiconducting polymer ranges from about 0.01:1 to about 1:1 to facilitate ion/charge mobility by providing a path for ion/charge motion from one ion-complexing side-chain group to another.

12. The method of claim 11, wherein the ion-complexing side-chain groups comprise at least one of pyridine, bipyridine, terpyridine, quaterpyridine, quinquepyridine, sexipyridine, phenanthroline, ethers, thioethers, and derivatives thereof.

13. The method of claim 11, wherein the ion-complexing groups are introduced into the semiconducting polymer during the formation of the semiconducting polymer layer.

14. The method of claim 11, wherein each monomeric precursor comprises one or more ion-complexing side-chain groups.

15. The method of claim 11, wherein the semiconducting polymer layer comprises from about 1% to about 99.99% by weight of the semiconducting polymer with ion-complexing side-chain groups and from about 99% to about 0.01% by weight of the semiconducting polymer with no ion-complexing side-chain groups.

16. The method of claim 11, wherein the ion-complexing groups are incorporated into monomeric precursors of the semiconducting polymers before forming the semiconducting polymer layer.

17. A method of fabricating an organic thin film transistor, comprising:
depositing a gate electrode;
forming an insulator adjacent to the gate electrode;
forming source and drain regions; and
forming a semiconducting polymer layer, wherein the semiconducting polymer layer comprises semiconducting polymers randomly oriented with one or more ion-complexing side-chain groups that reversibly binds, complexes, or accepts ions/charges, the proportion of ion-complexing side-chain groups to a monomeric precursor of the semiconducting polymer ranges from about 0.01:1 to about 1:1 to facilitate ion/charge mobility by providing a path for ion/charge motion from one ion-complexing side-chain group to another.

18. The method of claim 17, wherein the ion-complexing side-chain groups comprise at least one of pyridine, bipyridine, terpyridine, quaterpyridine, quinquepyridine, sexipyridine, phenanthroline, ethers, thioethers, and derivatives thereof.

19. The method of claim 17, wherein the ion-complexing side-chain groups comprise at least one of bipyridine, terpyridine, quaterpyridine, quinquepyridine, sexipyridine, phenanthroline, ethers, thioethers, and derivatives thereof.

20. The method of claim 17, wherein each monomeric precursor comprises one or more ion-complexing side-chain groups.

* * * * *